United States Patent
Kim et al.

(10) Patent No.: US 6,839,786 B2
(45) Date of Patent: Jan. 4, 2005

(54) INFORMATION PROCESSING SYSTEM WITH MEMORY MODULES OF A SERIAL BUS ARCHITECTURE

(75) Inventors: Kyung-Ho Kim, Kyunggi-do (KR); Jung-Hwan Choi, Kyunggi-do (KR); Nak-Won Heo, Yongin-shi (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 378 days.

(21) Appl. No.: 10/166,258

(22) Filed: Jun. 11, 2002

(65) Prior Publication Data

US 2002/0194416 A1 Dec. 19, 2002

(30) Foreign Application Priority Data

Jun. 14, 2001 (KR) .......................................... 2001-33551

(51) Int. Cl.[7] .............................. G06F 13/00; G06F 1/04

(52) U.S. Cl. ....................................... 710/300; 713/503

(58) Field of Search ................................. 710/100, 300, 710/301; 713/500, 503; 711/5, 105, 167; 326/30, 93

(56) References Cited

U.S. PATENT DOCUMENTS

| | | | | |
|---|---|---|---|---|
| 5,243,703 A | * | 9/1993 | Farmwald et al. | 713/400 |
| 6,067,594 A | * | 5/2000 | Perino et al. | 710/301 |
| 6,393,541 B1 | * | 5/2002 | Fujii | 711/167 |
| 6,681,338 B1 | * | 1/2004 | Kollipara | 713/503 |

OTHER PUBLICATIONS

Rambus: Enabling Maximum Performance in Desktop PCs, Rambus Inc., 1999.*

* cited by examiner

*Primary Examiner*—Khanh Dang
(74) *Attorney, Agent, or Firm*—Lee & Sterba, P.C.

(57) ABSTRACT

An information processing system for controlling clock skew preferably includes a first and a second memory module, each of which has at last one semiconductor integrated circuit and is controlled by a chipset which can selectively control the time delay of an individual clock signal based on a stored value. The system further includes a clock line, which includes a first and a second clock line segment forming a closed loop and at least one data line connected between the chipset and a first termination device. By designing each of the first and the second clock line segments to be the same length as the data line, the propagation time of a clock signal and a data signal may be accurately matched.

16 Claims, 3 Drawing Sheets

INFORMATION PROCESSING SYSTEM WITH MEMORY MODULES OF A SERIAL BUS ARCHITECTURE

BACKGROUND OF THE INVENTION

1. Field of the Invention

The present invention relates to generation and distribution of clock signals in a digital system. More particularly, the present invention relates to a digital information processing system with memory modules of a serial bus architecture.

2. Description of the Related Art

Generally, digital systems transfer and receive data signals by putting the data on a bus in synchronization with a clock signal, such that the data is valid on the bus at a time defined by the edge of the clock signal. Since transferring the data as soon as possible is preferable, a highest possible frequency is typically used. The maximum frequency for operation of the clock signal is controlled by three factors: a data set up time relative to the clock signal, a data hold time relative to the clock signal, and a clock skew. The clock skew includes a clock-to-clock skew (i.e., the edge of the clock signal is skewed with respect to the same phase of the clock signal in another portion of the circuit) and a clock-to-data skew (i.e., the edge of the clock signal is skewed with respect to the data on the bus).

In conventional digital systems, it is not normal for many circuit elements to be connected to a single clock signal or for a single driving circuit to drive the clock inputs of all circuit elements. Accordingly, clock buffers for copying the clock signal are typically used to distribute the clock signal to all elements requiring the clock signal. However, the clock buffers generate clock skew. To minimize the clock skew, the clock buffers are typically arranged in a tree-like clock distribution network such that the clock signal supplied to each element passes through an equal number of the clock buffers. Notwithstanding this effort, the skew between the clock buffers may still be present.

FIG. 1 illustrates a block diagram of a conventional information processing system according to the prior art. Referring to FIG. 1, the information processing system 10 includes a chipset (or a memory controller) 12 and Rambus in-line memory modules (RIMM) 14 and 16. The chipset 12 and the memory modules 14 and 16 are connected to a data bus 18, a clock line 20, and a reference voltage line 22. Although the data bus 18 is comprised of a plurality of data lines, for simplicity, it is shown as a single data line. A first termination of the data bus 18 is connected to the chipset 12, and a second termination of the data bus 18 is connected to a termination voltage (Vterm, for instance, 1.8 V) through a termination resistor (Rdata, for instance, 28Ω), which is used as a termination device. A first termination of the reference voltage line 22 is connected to the chipset 12, and a second termination of the reference voltage line 22 is connected to a reference voltage (Vref), which is used as a logic threshold reference voltage of RSL (Rambus signaling level) signal.

A clock generator 24 is connected to a first termination of the clock line 20. The termination voltage (Vterm) is connected to a second termination of the clock line 20 through a termination resistor (Rclk). The clock generator 24 generates a bus clock signal (for instance, 300–400 MHz) used in the chipset 12 and the memory modules 14 and 16. The clock line 20 includes a first and a second clock line segment 20a and 20b, respectively, which are electrically connected to each other at a U-turn (turnaround) point 20c passing through the chipset 12. Each of the clock line segments 20a and 20b has a same length and electrical characteristic as the data bus 18.

When data in the memory modules 14 or 16 is transferred to the chipset 12 as a master (that is, during a read operation wherein the data is transferred to the chipset from the memory modules), the first clock line segment 20a (or a Clock To Master signal (CTM), transferred through the first clock line segment) is used. Alternatively, during a write operation, the data is transferred to memory modules 14 or 16 from the chipset, and a second clock line segment 20b (Clock From Master signal (CFM) transferred through the second clock line segment) is used. A length of the first clock line segment 20a is the length from the clock generator 24 to the chipset 12 (for instance, 2L), a length of the second clock line segment 20b is the length from the chipset 12 to the termination resistor (Rclk) (for instance, 2L), and a length of the data bus 18 is the length from the chipset 12 to the termination resistor (Rdata) (for instance, 2L).

Presently, a serial bus architecture is adapted in the RIMM as a Rambus dynamic random access memory (DRAM) module system. The RIMM may be operated in high frequency since the RIMM can be double-synchronized to the CTM clock signal and the CFM clock signal may serve as the bus clock signal on a same channel. As previously described, the CTM clock signal is an interface clock signal used to transfer Rambus Signaling Levels (RSL) signals to the channel, and the CFM clock signal is an interface clock signal for receiving RSL signals from the channel.

Even though this serial bus architecture is used, the clock signal is skewed as the operation frequency increases due to routing lengths of the clock line 20 and the data bus 18 being different. In the example shown in FIG. 1, the length between the first termination and the second termination of the clock line 20 including the first and the second clock line segments 20a, 20b is 4L, while the length between the first and second terminations of the data bus 18 is 2L. Thus, as the operation frequency increases, the clock signal transferred through the clock line 20 will be more attenuated compared with the data signal transferred through the data bus 18. Also, as the operation frequency increases, a memory device mounted on the memory module 16 farthest from the chipset 12 may not perform an accurate read or write operation due to the attendant skew of the clock signal (i.e., the level of the clock signal is attenuated).

SUMMARY OF THE INVENTION

According to a feature of an embodiment of the present invention, there is provided an information processing system having a serial bus architecture that is capable of matching the propagation times of both a clock signal and a data signal.

According to a feature of an embodiment of the present invention, an information processing system having 1) a plurality of modules of an even number in which each module has at least one semiconductor integrated circuit and 2) a chipset for controlling the plurality of modules, preferably includes at least one data line having a first termination connected to the chipset and a second termination connected to a first termination device and a clock line divided into a first and a second clock line segment, wherein each clock line segment has a first and a second termination, with a second termination device connected commonly to the first terminations of the first and the second clock line segments and a clock generator connected commonly to the second terminations of the first and the second clock line segments. The clock generator generates a clock signal that is transferred through the first and the second clock line segments, wherein the second termination device and the clock generator are placed such that each of the first and the second clock line segments has a same length as the data line.

The first termination devices may include a resistor connected between a termination voltage and the second termination of the data line. The second termination device may include a resistor having one end connected commonly to the first terminations of the first and the second clock line segments and another end connected to a termination voltage. Each of the plurality of modules may include a Rambus in-line memory module (RIMM). The first and the second clock line segments may form a closed loop, wherein the closed loop has a first and a second U-turn portions, and the first U-turn portion passes through the chipset.

In an alternate embodiment according to the present invention, an information processing system preferably includes: a first and a second module in which each module has at least one semiconductor integrated circuit; a chipset for controlling the first and the second modules; a clock line having a first and a second clock line segment forming a closed loop; a data line having a first termination connected to the chipset and a second termination connected to a first termination device; a clock generator connected commonly to first terminations of the first and the second clock line segments, and being placed between the first and the second modules; and a second termination device connected commonly to second terminations of the first and the second clock line segments, and being placed between the first and the second modules, wherein each of the first and the second clock line segments has a same length as the data line.

The first termination device may include a resistor connected between a termination voltage and the second termination of the data line. The second termination device may include a resistor having one end connected commonly to the second terminations of the first and the second clock line segments and another end connected to a termination voltage. Each of the first and the second modules may include a Rambus in-line memory module (RIMM), and the closed loop of the clock line preferably has a first and a second U-turn portion, wherein the first U-turn portion passes through the chipset, and the second U-turn portion is placed on the opposite side of the first U-turn portion.

In a third embodiment according to the present invention, an information processing system preferably includes: a first and a second Rambus in-line memory module (RIMM); a memory controller for controlling the first and the second Rambus in-line memory modules; a clock line having a first and a second clock line segment forming a closed loop; a data line having a first termination connected to the memory controller and a second termination; a first resistor connected between the second termination of the data line and a termination voltage; a clock generator connected commonly to first terminations of the first and the second clock line segments, and being placed between the first and the second Rambus in-line memory modules; and a second resistor having one end connected commonly to second terminations of the first and the second clock line segments and another end connected to the termination voltage, and being placed between the first and the second Rambus in-line memory modules, wherein each of the first and the second clock line segments has a same length as the data line.

In a fourth embodiment according to the present invention, an information processing system preferably includes: at least two modules in which each module has a plurality of semiconductor integrated circuits; a memory controller for controlling the modules; a data bus having a first termination connected to the memory controller and a second termination; a first termination device connected to the second termination of the data bus; a clock line including a first and a second clock line segment in which each segment has a first and a second termination; a first clock generator connected to the first termination of the first clock line segment for generating a first clock signal transferred through the first clock line segment; a second termination device connected to the second termination of the first clock line segment via the memory controller; a second clock generator connected to the first termination of the second clock line segment via the memory controller for generating a second clock signal transferred through the second clock line segment; a third termination device connected to the second termination of the second clock line segment, wherein each of the first and the second clock line segments has a same length as the data bus.

Each of the second and the third termination devices may include a resistor connected between a termination of corresponding clock line segment and a termination voltage. Each of the first and the second clock generators may generate a bus clock signal having a same frequency.

Each of the modules preferably uses a first clock signal on one segment of the first and second clock line segments as an input clock signal and uses a second clock signal on another segment as an output clock signal. Each of the modules may include a Rambus in-line memory module.

These and other features and aspects of the present invention will be readily apparent to those of ordinary skill in the art upon review of the detailed description that follows.

DETAILED DESCRIPTION OF THE INVENTION

Korean Patent Application No. 2001-33551, filed on Jun. 14, 2001, and entitled: "Information Processing System with Memory Modules of a Serial Bus Architecture," is incorporated by reference herein in its entirety.

The present invention will be described more fully hereinafter with reference to the accompanying drawings, in which preferred embodiments of the present invention are shown. The present invention may, however, be modified in different forms and should not be construed as limited to the embodiments set forth herein. Rather, these embodiments are provided so that this disclosure will be thorough and complete, and will fully convey the scope of the invention to those of ordinary skill in the art. Like numbers refer to like elements throughout.

Figure 1:
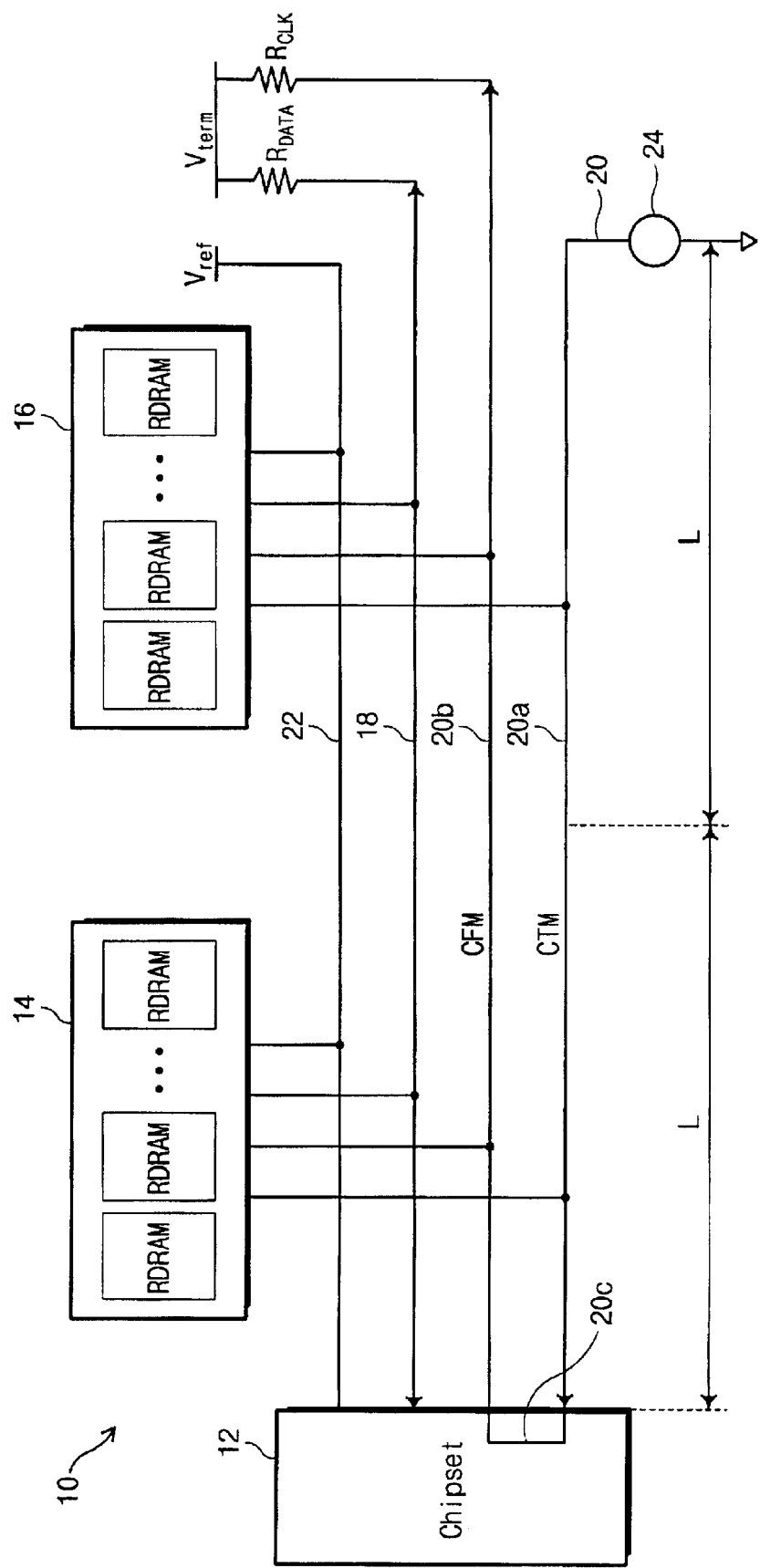
FIG. 1 illustrates a block diagram of a conventional information processing system according to the prior art.
Figure 2:
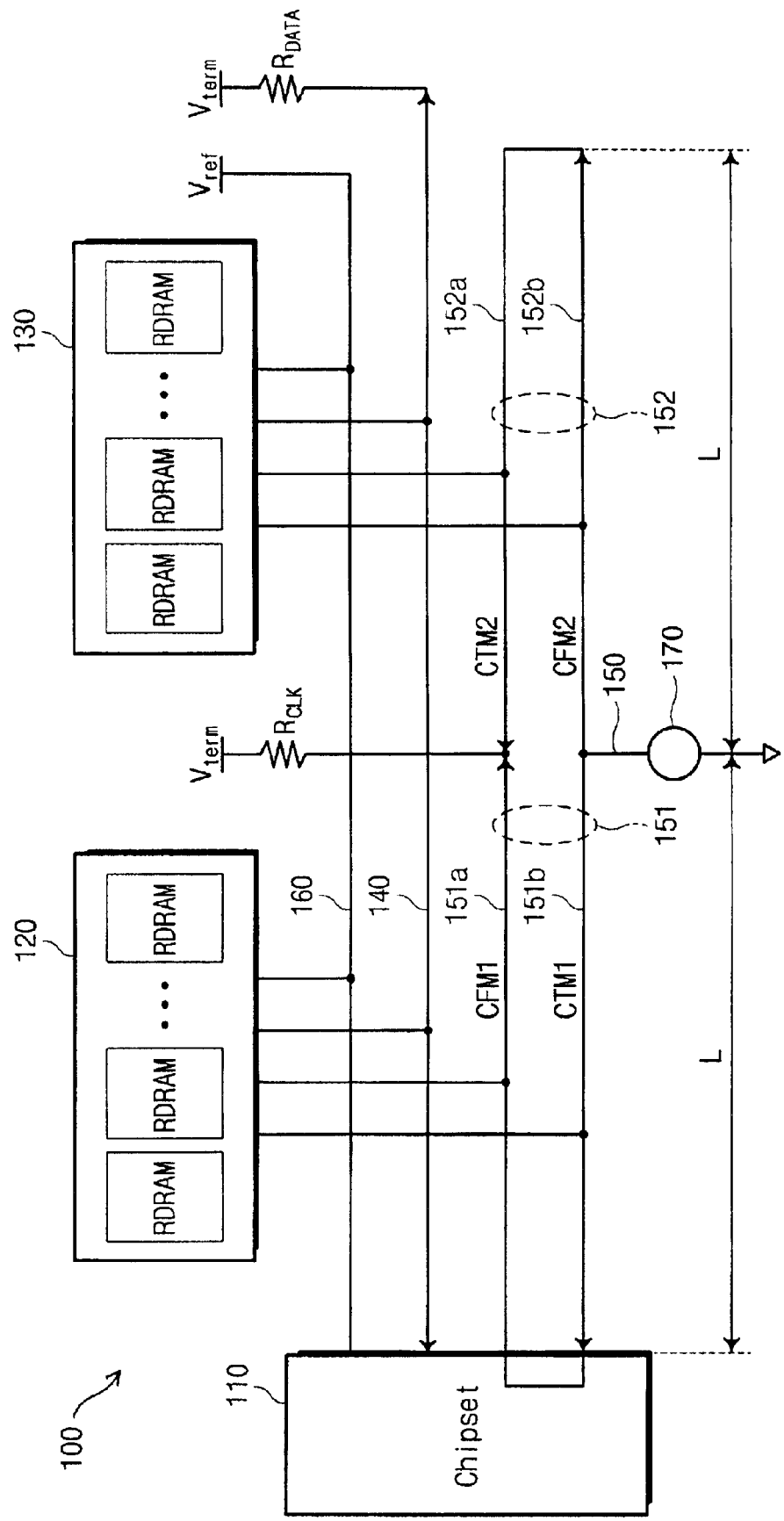
FIG. 2 illustrates a block diagram of an information processing system according to a first embodiment of the present invention.

FIG. 2 illustrates a block diagram of an information processing system according to a first embodiment of the present invention. Referring to FIG. 2, an information processing system 100 preferably includes a chipset 110

(hereinafter, a memory controller) and a first and a second Rambus in-line memory modules (RIMM) 120 and 130, respectively. The memory controller 110 and the first and the second RIMM 120 and 130, respectively, are connected to a data bus 140, a clock line 150 and a reference voltage line 160. For the simplicity, the data bus 140 is represented as a single data line. A first termination of the data bus 140 is connected to the memory controller 110 and a second termination of the data bus 140 is connected to a termination voltage (Vterm, for instance, 1.8 V) through a termination resistor (Rdata, for instance, 28Ω), which is used as a termination device. A first termination of the reference voltage line 160 is connected to the memory controller 110, and a second termination of the reference voltage line 160 is connected to a reference voltage (Vref). The reference voltage (Vref) is used as a logic threshold reference voltage of Rambus Signaling Levels (RSL) signal.

The clock line 150, as shown in FIG. 2, preferably has a closed loop structure comprised of a first clock line segment 151 and a second clock line segment 152. Each of the first and the second clock line segments 151 and 152, respectively, has a U-turn portion and a first and a second clock termination. The first clock terminations of the first and the second clock line segments 151 and 152, respectively, are commonly connected to a clock generator 170, and the second clock terminations of the first and the second clock line segments 151 and 152, respectively, are connected to a termination voltage (Vterm) through a termination resistor (Rclk). The termination resistor (Rclk) and the clock generator 170 are preferably placed between the first and the second RIMM 120 and 130, respectively.

According to this embodiment, assuming that the distance between the memory controller 110 and the clock generator 170 is defined as "L", the distance (2L) between the clock generator 170 and the termination resistor (Rclk) becomes identical with the distance (2L) of the data bus 140. That is, the distance of the first clock line segment 151 placed between the clock generator 170 and the termination resistor (Rclk) is identical with the distance of the second clock line segment 152 placed between the clock generator 170 and the termination resistor (Rclk). Similarly, each distance (2L) of the first and the second clock line segments 151 and 152, respectively, is identical with the distance (2L) of the data bus 140. By matching the distances of the clock line and the data line, the propagation times of a clock signal and a data signal may be accurately matched. Consequently, even if the operating frequency is increased, stable operation of memory devices may be obtained.

Under this bus architecture, when the data provided from the memory controller 110 is stored to the memory device mounted on the RIMM, the first RIMM 120 uses a first clock signal (CFM1) and the second RIMM 130 uses a second clock signal (CFM2). That is, the first clock signal (CFM1) on a first clock signal segment 151a between the U-turn portion and the termination resistor (Rclk) is used as a data input clock of the first RIMM 120. Similarly, the second clock signal (CFM2) on a second clock signal segment 152b between the U-turn portion and the termination resistor (Rclk) is used as a data input clock of the second RIMM 130. When the data is read from the memory device, the first RIMM 120 uses the first clock signal (CTM1) and the second RIMM 130 uses the second clock signal (CTM2). That is, the first clock signal (CTM1) on a third clock signal segment 151b between the U-turn portion and the termination resistor (Rclk) is used as a data output clock of the first RIMM 120. The second clock signal (CTM2) on a fourth clock signal segment 152a between the U-turn portion and the termination resistor (Rclk) is used as a data output clock of the second RIMM 130.

As is well known, since clock domain changes occur between the clock generator 170 and the termination resistor (Rclk) when the data is read or written in the memory controller 110, a time tTR (indicating a phase difference between the clock signals CFM and CTM) of each Rambus DRAM mounted on the first RIMM 120 is preferably set to a value in the range of 0–2, and a corresponding time tTR of each Rambus DRAM mounted on the second RIMM 130 is set to a value in the range of 3–5. Such setting procedures are preferably implemented as follows. First, each Rambus DRAM mounted on each RIMM stores tTR time information internally in a register (not shown). Next, the memory controller sets the system tTR values by reading the tTR time information stored in each Rambus DRAM. Thus, a unique skew is generated for each clock line between the clock generator 170 and the termination resistor (Rclk).

The first embodiment described in relation to FIG. 2 may be easily expanded to a configuration having an even number of modules. For example, if a system is comprised of four (4) RIMMs, a clock generator and termination device on a clock line may be placed between left two RIMMs and right two RIMMs. Similarly, if a system is comprised of six (6) RIMMs, a clock generator and termination device on a clock line may be placed between left three RIMMs and right three RIMMs.

Figure 3:
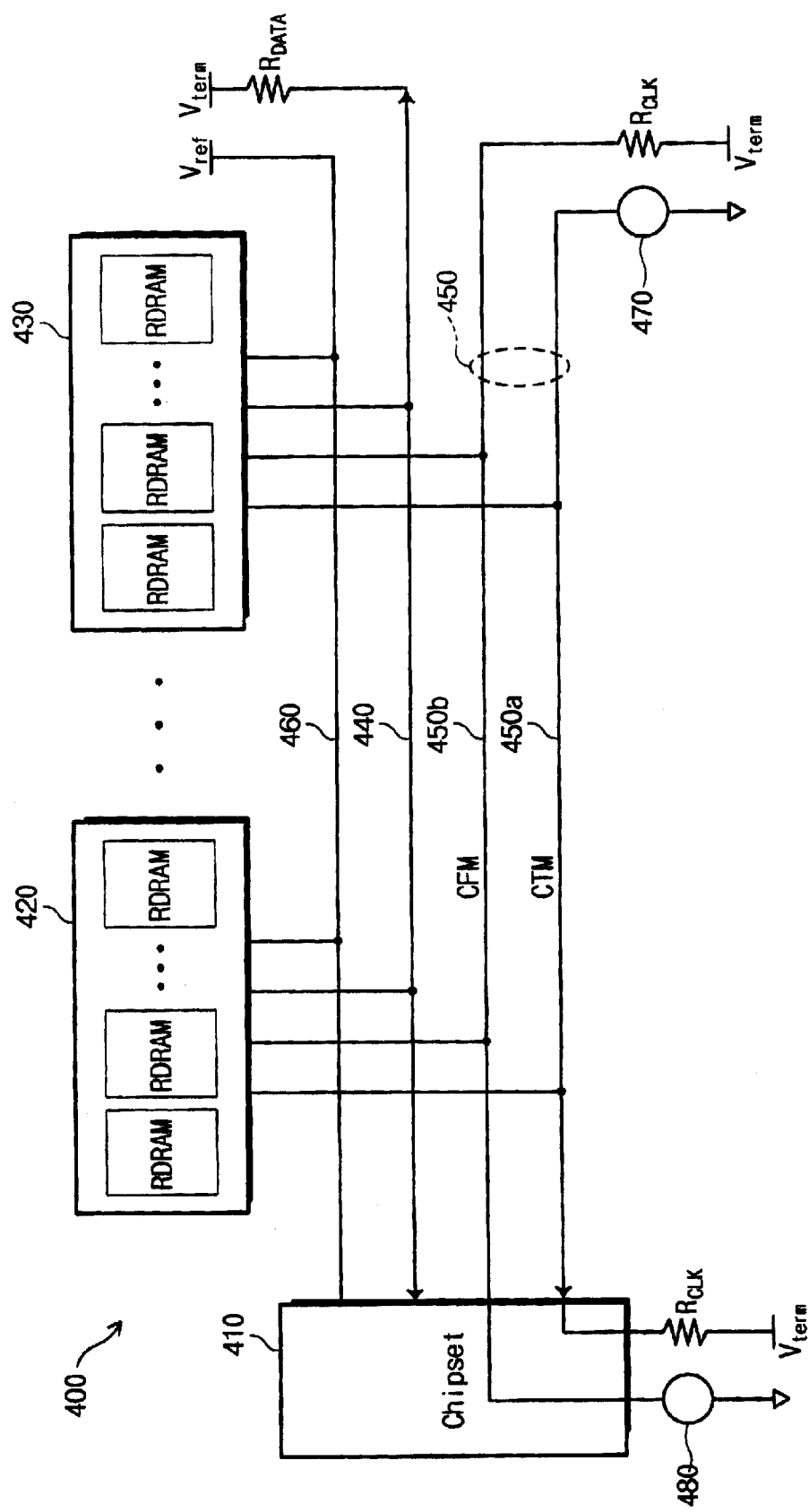
FIG. 3 illustrates a block diagram of an information processing system according to a second embodiment of the present invention.

FIG. 3 illustrates a block diagram of an information processing system according to a second embodiment of the present invention. Referring to FIG. 3, an information processing system 400 preferably includes a memory controller 410, which may be a chipset, and at least two (2) RIMMs 420 and 430. The memory controller 410 and the RIMMs 420 and 430 are connected to a data bus 440, a clock line 450 and a reference voltage line 460. A first termination of the data bus 440 is preferably connected to the memory controller 410, and a second termination of the data bus 440 is connected to a termination voltage (Vterm, for instance, 1.8 V) through a termination resistor (Rdata, for instance, 28Ω) used as a termination device. A first termination of the reference voltage line 460 is connected to the memory controller 410, and a second termination of the reference voltage line 460 is connected to a reference voltage (Vref).

The clock line 450 is preferably further comprised of a first clock line segment 450a and a second clock line segment 450b. A first termination of the first clock line segment 450a is connected to a first clock generator 470, and a second termination of the first clock line segment 450a is connected to one end of a first termination resistor (Rclk) via the memory controller 410. Another end of the first termination resistor (Rclk) is connected to a termination voltage (Vterm). A first termination of the second clock line segment 450b is connected to a termination voltage (Vterm) through a second termination resistor (Rclk), and a second termination of the second clock line segment 450b is connected to a second clock generator 480 via the memory controller 410.

Each of the first and the second clock generators 470 and 480, respectively, generates a bus clock signal having a same frequency. The data bus 440, the first clock line segment 450a and the second clock line segment 450b preferably have an identical length. The two RIMMs 420 and 430 use a clock signal (CFM) on the second clock line segment 450b as input clock signals, and use a clock signal (CTM) on the first clock line segment 450a as output clock signals. The separate clock generating circuits are synchronized automatically by such as a phase locked loop (PLL) or a delay locked loop (DLL).

The termination resistors (Rclk) of the embodiments of the present invention may be set to identical values, and the termination voltages (Vterm) of the embodiments of the present invention may be also set to identical values.

In a third embodiment according to the present invention, an information processing system preferably includes: a first and a second Rambus in-line memory module (RIMM); a memory controller for controlling the first and the second Rambus in-line memory modules; a clock line having a first and a second clock line segment forming a closed loop; a data line having a first termination connected to the memory controller and a second termination; a first resistor connected between the second termination of the data line and a termination voltage; a clock generator connected commonly to first terminations of the first and the second clock line segments, and being placed between the first and the second Rambus in-line memory modules; and a second resistor having one end connected commonly to second terminations of the first and the second clock line segments and another end connected to the termination voltage, and being placed between the first and the second Rambus in-line memory modules, wherein each of the first and the second clock line segments has a same length as the data line.

In a fourth embodiment according to the present invention, an information processing system preferably includes: at least two modules in which each module has a plurality of semiconductor integrated circuits; a memory controller for controlling the modules; a data bus having a first termination connected to the memory controller and a second termination; a first termination device connected to the second termination of the data bus; a clock line including a first and a second clock line segment in which each segment has a first and a second termination; a first clock generator connected to the first termination of the first clock line segment for generating a first clock signal transferred through the first clock line segment; a second termination device connected to the second termination of the first clock line segment via the memory controller; a second clock generator connected to the first termination of the second clock line segment via the memory controller for generating a second clock signal transferred through the second clock line segment; a third termination device connected to the second termination of the second clock line segment, wherein each of the first and the second clock line segments has a same length as the data bus.

Each of the second and the third termination devices may include a resistor connected between a termination of a corresponding clock line segment and a termination voltage. Each of the first and the second clock generators may generate a bus clock signal having a same frequency. Each of the modules preferably uses a first clock signal on one segment of the first and second clock line segments as an input clock signal and uses a second clock signal on another segment as an output clock signal. Each of the modules may include a Rambus in-line memory module.

According to the embodiments of the present invention, a clock line having a closed loop is configured so that the clock line has an identical length as a data line. By matching the distances of the clock line and the data line, the propagation times of a clock signal and a data signal may be accurately matched. Consequently, even if the operational frequency is increased, stable operation of memory devices may be obtained.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An information processing system having a plurality of modules of an even number in which each module has at least one semiconductor integrated circuit, and a chipset for controlling the plurality of modules, comprising:

a data line having a first termination connected to the chipset and a second termination;

a first termination device connected to the second termination of the data line;

a clock line divided into a first and a second clock line segments, wherein each clock line segment has a first and a second termination;

a second termination device connected commonly to the first terminations of the first and the second clock line segments; and a clock generator connected commonly to the second terminations of the first and the second clock line segments, and for generating a clock signal that is transferred through the first and the second clock line segments, wherein the second termination device and the clock generator are placed such that each of the first and the second clock line segments has a same length as the data line.

2. The information processing system as claimed in claim 1, wherein the first termination device includes a resistor connected between a termination voltage and the second termination of the data line.

3. The information processing system as claimed in claim 1, wherein the second termination device includes a resistor having one end connected commonly to the first terminations of the first and the second clock line segments and another end connected to a termination voltage.

4. The information processing system as claimed in claim 1, wherein each of the plurality of modules includes a Rambus in-line memory module (RIMM).

5. The information processing system as claimed in claim 1, wherein the first and the second clock line segments form a closed loop, the closed loop having a first and a second U-turn portion, and the first U-turn portion passes through the chipset.

6. An information processing system comprising:

a first and a second module in which each module has at least one semiconductor integrated circuit;

a chipset for controlling the first and the second modules;

a clock line having a first and a second clock line segment forming a closed loop;

a data line having a first termination connected to the chipset and a second termination connected to a first termination device;

a clock generator connected commonly to first terminations of the first and the second clock line segments, and being placed between the first and the second modules; and a second termination device connected commonly to second terminations of the first and the second clock line segments, and being placed between the first and the second modules, wherein each of the first and the second clock line segments has a same length as the data line.

7. The information processing system as claimed in claim 6, wherein the first termination device includes a resistor connected between a termination voltage and the second termination of the data line.

8. The information processing system as claimed in claim 6, wherein the second termination device includes a resistor having one end connected commonly to the second terminations of the first and the second clock line segments and another end connected to a termination voltage.

9. The information processing system as claimed in claim 6, wherein each of the first and the second modules includes a Rambus in-line memory module (RIMM).

10. The information processing system as claimed in claim 6, wherein the closed loop has a first and a second U-turn portion, the first U-turn portion passing through the chipset, and the second U-turn portion being placed on the opposite side of the first U-turn portion.

11. An information processing system comprising:

a first and a second Rambus in-line memory module (RIMM);

a memory controller for controlling the first and the second Rambus in-line memory modules;

a clock line having a first and a second clock line segment forming a closed loop;

a data line having a first termination connected to the memory controller and a second termination;

a first resistor connected between the second termination of the data line and a termination voltage;

a clock generator connected commonly to first terminations of the first and the second clock line segments, and being placed between the first and the second Rambus in-line memory modules; and a second resistor having one end connected commonly to second terminations of the first and the second clock line segments and another end connected to the termination voltage, and being placed between the first and the second Rambus in-line memory modules, wherein each of the first and the second clock line segments has a same length as the data line.

12. An information processing system comprising:

at least two modules in which each module has a plurality of semiconductor integrated circuits;

a memory controller for controlling the modules;

a data bus having a first termination connected to the memory controller and a second termination;

a first termination device connected to the second termination of the data bus;

a clock line including a first and a second clock line segment in which each segment has a first and a second termination;

a first clock generator connected to the first termination of the first clock line segment, and for generating a first clock signal transferred through the first clock line segment;

a second termination device connected to the second termination of the first clock line segment via the memory controller;

a second clock generator connected to the first termination of the second clock line segment via the memory controller, and for generating a second clock signal transferred through the second clock line segment;

a third termination device connected to the second termination of the second clock line segment, wherein each of the first and the second clock line segments has a same length as the data bus.

13. The information processing system as claimed in claim 12, wherein each of the second and the third termination devices includes a resistor connected between a termination of a corresponding clock line segment and a termination voltage.

14. The information processing system as claimed in claim 12, wherein each of the first and the second clock generators generates a bus clock signal having a same frequency.

15. The information processing system as claimed in claim 12, wherein each of the modules uses a first clock signal on one segment of the first and second clock line segments as an input clock signal, and uses a second clock signal on another segment as an output clock signal.

16. The information processing system as claimed in claim 12, wherein each of the modules includes a Rambus in-line memory module.

* * * * *